United States Patent [19]

Wong et al.

[11] Patent Number: 4,646,269

[45] Date of Patent: Feb. 24, 1987

[54] MULTIPLE PROGRAMMABLE INITIALIZE WORDS IN A PROGRAMMABLE READ ONLY MEMORY

[75] Inventors: Sing Y. Wong, Sunnyvale; Johnny Chen, Milpitas, both of Calif.

[73] Assignee: Monolithic Memories, Inc., Santa Clara, Calif.

[21] Appl. No.: 652,352

[22] Filed: Sep. 18, 1984

[51] Int. Cl.$^4$ ............................................. G11C 8/00
[52] U.S. Cl. ..................................... 365/230; 365/189
[58] Field of Search ........................ 365/230, 200, 189

[56] References Cited

U.S. PATENT DOCUMENTS 4,281,398  7/1981  McKenny et al. .................. 365/200

Primary Examiner—Joseph A. Popek
Attorney, Agent, or Firm—Steven F. Caserza; Alan H. MacPherson; Kenneth E. Leeds

[57] ABSTRACT

A programmable read-only memory (40) is provided which is capable of storing a plurality of initialize words. The memory includes an initialize input lead (9) and appropriate addressing circuitry (7) so that when the appropriate initialize input signal is placed on the initialize input lead, one of several pre-programmed initialize words is placed in the output register (6) of the programmable read-only memory. The word that is placed in the output register is selected according to signals applied to selected address input leads ($A_0$ through $A_3$) of the programmable read-only memory. The number of address input signals utilized to determine which initialize word is placed in the output register of the programmable read-only memory is a selected subset of the available address input signals provided to the memory. The described embodiment provides sixteen initialize words using a minimum number of components. The sixteen initialize words are stored in an additional row (12) of the programmable array which contains the memory's normally addressable data words. Because the initialize word circuit (12) is configured as an extra row of the programmable array, the initialize word occupies less chip area than a conventional initialize word circuit. In addition, fewer components are necessary to implement the initialize word circuit of this invention because the inherent selection circuitry of the programmable array is used rather than circuitry which deselects the normal data word provided by the programmable array.

4 Claims, 3 Drawing Figures

MULTIPLE PROGRAMMABLE INITIALIZE WORDS IN A PROGRAMMABLE READ ONLY MEMORY

BACKGROUND OF THE INVENTION

This invention relates to the use of initialize words in, for example, read-only memories (ROMs). An initialize word is a binary data word stored in a memory circuit which is placed on the output leads or in an output register of the memory circuit when an initialization signal is received by the memory circuit on an initialize input terminal. One example of a memory device which may use an initialize word is a programmable read-only memory (PROM).

A PROM is a user programmable memory device from which previously stored data is read out in a nondestructive manner. The data to be read is identified by a binary address input signal representing the address of a data word in the PROM. When an address signal corresponding to the address of a stored data word is placed on the address input leads of the PROM, the PROM places that stored data word in the output register of the PROM. From the output register the data word is transferred to the output terminals of the device. PROMs often contain program instructions for a microprocessor or a central processing unit of a computer. In certain circumstances, such as power interruptions or excessively high temperature within the computer, it is necessary to interrupt the normal pattern of program instructions which are provided by the PROM in response to address signals received by the PROM. In such circumstances, it is useful to have the capability to provide a preselected data word in an output register of the PROM in response to an initialize signal received by the PROM on an initialize input terminal.

One method of implementing a PROM is shown in the block diagram of FIG. 1. PROM 30 is a prior art 1K byte PROM which contains one thousand and twenty-four binary data words each containing eight (8) bits. Decoder 1 receives address input signals on address input leads $A_4$ through $A_9$ Decoder 1 selects one of output leads 10-1 through 10-64 in response to the address input signals on address input leads $A_4$ through $A_9$, places a logical 1 on the selected lead, and places a logical 0 on all the remaining deselected decoder output leads. Leads 10-1 through 10-64 are also the input leads for programmable memory array 2.

Programmable memory array 2 provides 16 eight bit data words in response to the high level signal provided on a selected one of leads 10-1 through 10-64. These sixteen data words are transmitted by data bus 3 to 1:16 multiplexer 4. Multiplexer 4 is controlled by signals from decoder 7, which are transmitted on control bus 11.

Decoder 7 receives input signals on address input leads $A_0$ through $A_3$. Control bus 11 includes 16 control leads 11-1 through 11-16. Decoder 7 selects one of control leads 11-1 through 11-16 in response to the signal on address input leads $A_0$ through $A_3$, provides a logical 1 on the selected control lead, and provides logical 0 on all the remaining deselected leads of data bus 11. Multiplexer 4 selects one of the 16 eight-bit binary words carried by data bus 3 in response to the signal provided on data bus 11 and provides the selected eight-bit word to output register 6 via data bus 19, initialize word register 5, and data bus 20. Output register 6 provides the selected eight-bit word on output leads $O_0$ through $O_7$ or, alternatively, the initalize word stored in initialize word register 5.

FIG. 2 is a schematic diagram of one embodiment of programmable array 2 of FIG. 1 which contains an array of 64 rows, each row having 128 memory cells. Input lead 10-X, where X is an integer given by $1 \leq X \leq 64$, is connected to the bases of transistors 15-X-1 through 15-X-128. Programmable array 2 is programmed to contain the data desired to be stored in the PROM by selectively opening fuses 16-1-1 through 16-64-128 by means well known in the art (not shown). When a logical 1 is placed on the base of transistor 15-X-Y, where Y is an integer given by $1 \leq Y \leq 128$ and when fuse 16-X-Y is intact, the signal on output lead 3-Y is a logical 1. Conversely, when a logical 1 is on the base of transistor 15-X-Y and fuse 16-X-Y is open, the output signal on output lead 3-Y is a logical 0. Therefore, by placing a logical 1 on one selected input lead, 10-X, and by placing a logical 0 on the unselected input leads, the output signal on output leads 3-1 through 3-128 is entirely dependent upon the status of fuses 16-X-1 through 16-X-128. Therefore, 16 eight bit data words are stored in each of the 64 rows of programmable array 2 by selectively opening fuses 16-X-1 through 16-X-128 and 1024 eight bit data words are stored in programmable array 2 by selectively opening fuses 16-1-1 through 16-64-128.

Returning to FIG. 1, when a logical 1 initialize input signal is placed on initialize input terminal 9, the output signal from inverter 8 is a logical 0. When the signal on lead 18 is a logical 0, decoder 7 is enabled and decodes address signals $A_0$ through $A_3$, as previously described. The output signals from multiplexer 4 are transmitted by leads 19-1 through 19-8 to the input leads of initialize word circuit 5. When the signal on lead 18 is a logical 0, the signals provided by initialize word register 5 on leads 20-1 through 20-8 are identical to the signals provided by multiplexer 4 on leads 19-1 through 19-8, respectively. Conversely, when a logical 0 initialize input signal is placed on initialize input terminal 9, inverter 8 provides a logical 1 output signal. When the output signal from inverter 8 is a logical 1, decoder 7 is disabled, and logical 0 signals are provided on all leads 11-1 through 11-16, thus disabling multiplexer 4. When the input signal on lead 18 is a logical 1, the signals provided on leads 20-1 through 20-8 are pre-programmed signals contained in initialize word register 5. These pre-programmed data signals are programmed into initialize word circuit 5 using techniques well known in the art, for example in the same fashion that data is stored in the memory cells of array 2. Therefore, when the input signal on lead 18 is a logical 1, the eight bit initialize word stored in initialize word circuit 5 is placed in output register 6 via data bus 20 and thus is provided on output data leads $O_0$ through $O_7$ by output register 6.

This initialize word function, whereby a predetermined word is selectively placed in output register 6 in response to an initialize input signal is useful, for example, upon system start-up, restart of the system after power interruptions, and user initiated reinitialization of a computer system. However, although there are many circumstances where an initialize word would be useful, the prior art system shown in FIG. 1 provides only one initialize word.

SUMMARY

In accordance with this invention, a programmable read-only memory is provided which is capable of storing a plurality of initialize words. The memory includes an initialize input lead and appropriate addressing circuitry so that when an initialize input signal is placed on the initialize input lead, a selected one of several preprogrammed initialize words is placed in the output register of the programmable read-only memory. The word that is placed in the output register is selected according to signals applied to address input leads of the programmable read-only memory. The number of address input signals utilized to determine which initialize word is placed in the output register of the progammable read-only memory is a selected subset of the available address input signals provided to the memory.

The described embodiment provides sixteen initialize words using a minimum number of components. The sixteen data words are stored in an additional row of the programmable array which contains the memory's normally addressable data words. Because the initialize word circuit is configured as an extra row of the programmable array, the initalize word occupies less area on the integrated circuit than a conventional initialize word circuit. In addition, fewer components are necessary to implement an initialize word function according to this invention because the inherent selection circuitry of the programmable memory array is used rather than circuitry which deselects the normal data word provided by the programmable memory array.

DETAILED DESCRIPTION

Figure 1:
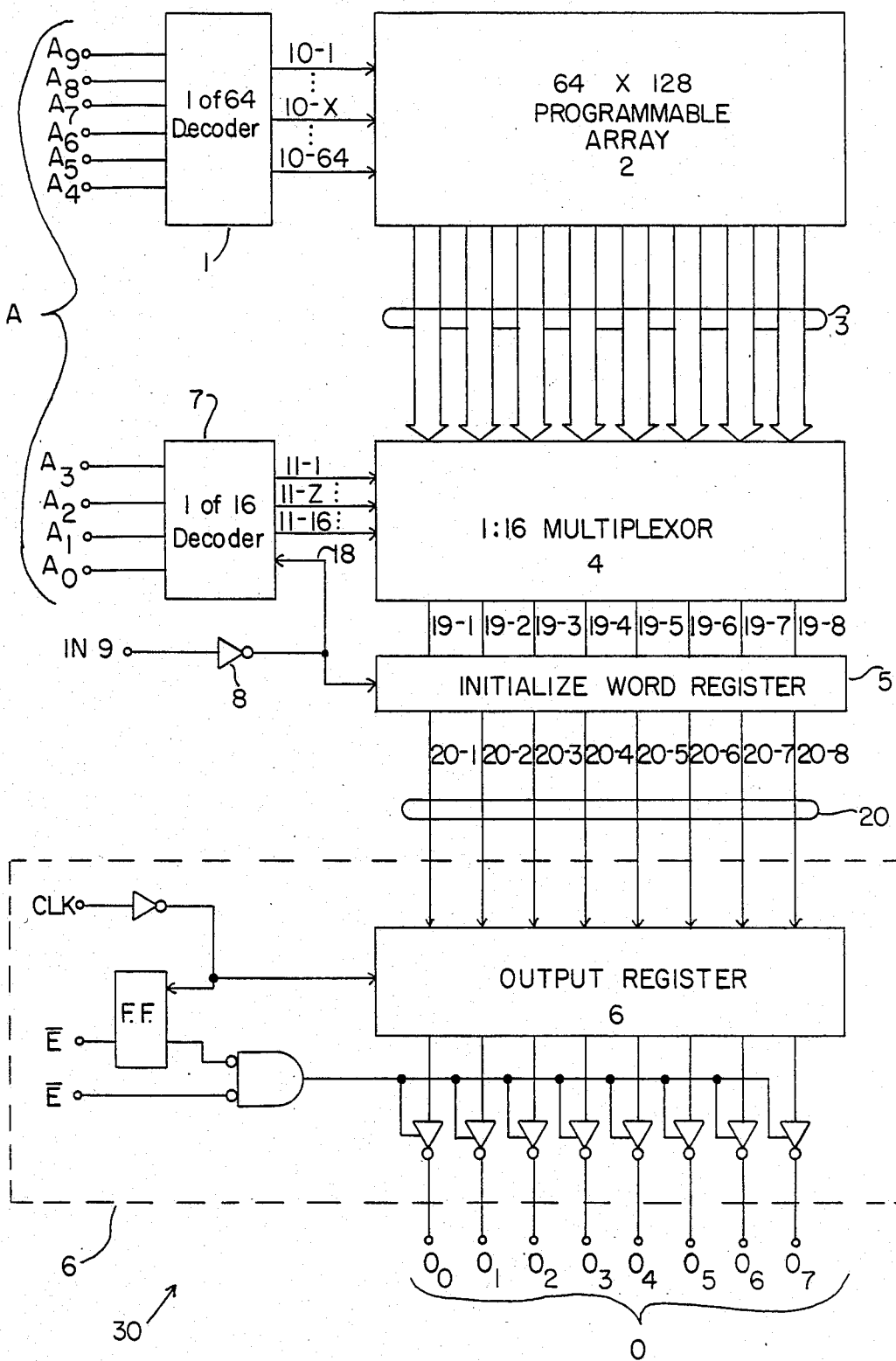
FIG. 1 is a block diagram of a prior art programmable read-only memory with a single initialize word.
Figure 2:
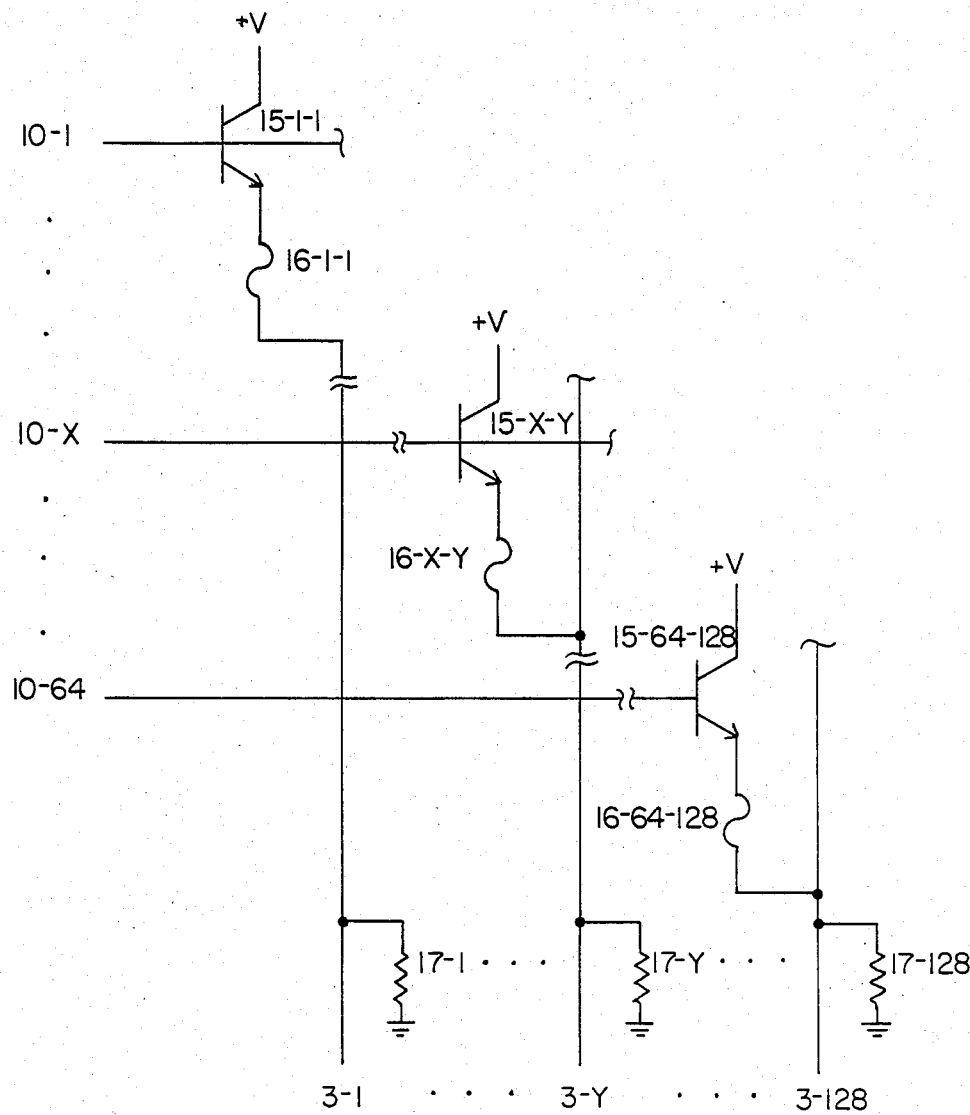
FIG. 2 is a schematic diagram of programmable array 2 in FIG. 1.
Figure 3:
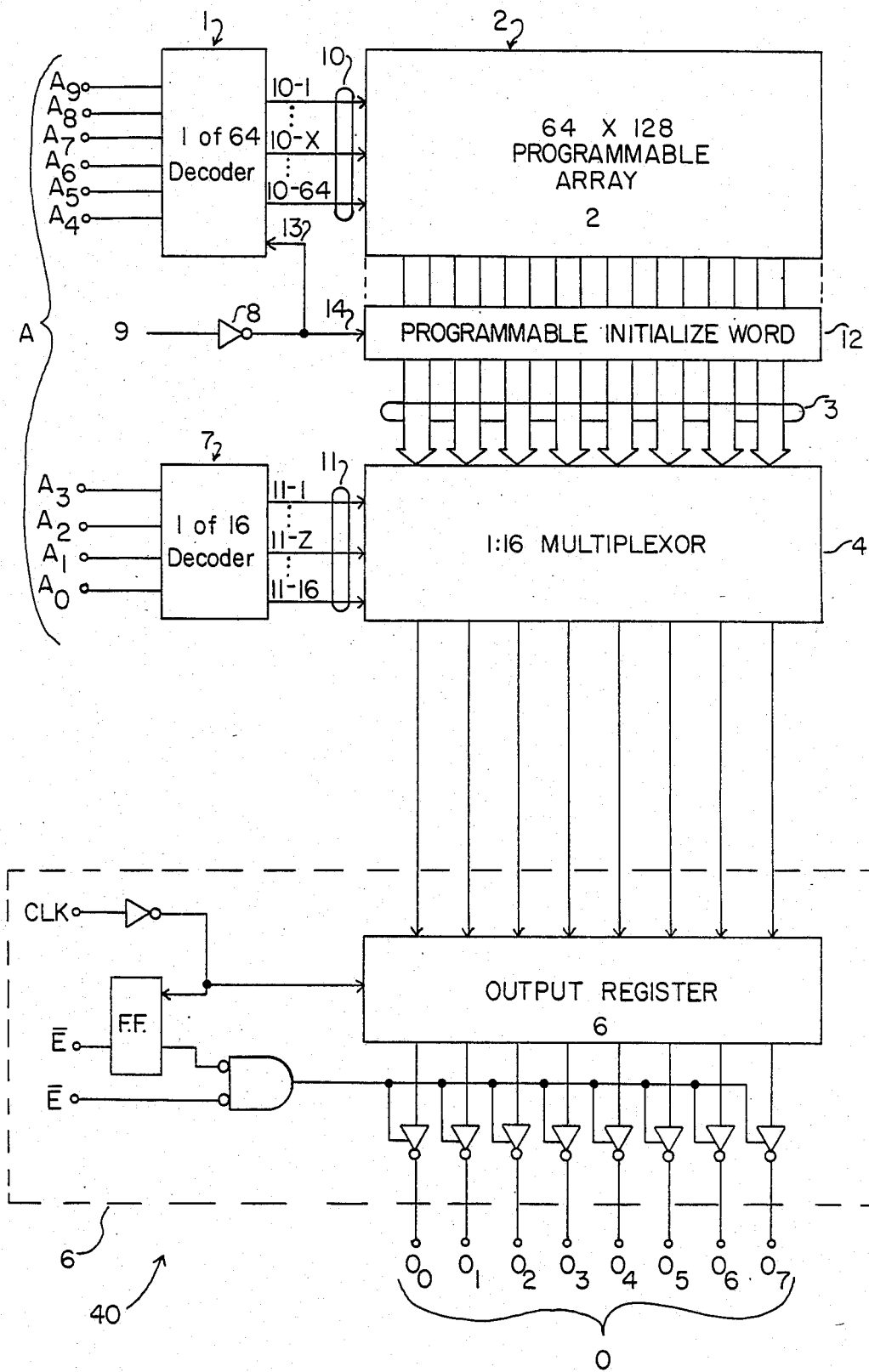
FIG. 3 is a block diagram of one embodiment of a circuit constructed in accordance with the teachings of the present invention which comprises a programmable read-only memory capable of providing multiple initialize words.

FIG. 3 is a block diagram of one embodiment of a circuit constructed in accordance with this invention including multiple initialize words. Components numbered similarly in FIGS. 1 and 3 perform the same function.

Initialize input lead 9 receives an initialize signal which indicates whether PROM 40 is to provide a data word selected in response to the address signals on address input leads $A_0$ through $A_9$, or one of sixteen initialize data words. When a logical 0 initialize input signal is placed on input lead 9, the output signal from inverter 8 is a logical 1 which is applied to leads 13 and 14. When a logical 1 input signal is placed on input lead 13 of decoder 1, decoder 1 places a logical 0 on all 64 data leads of control bus 10, thereby deselecting all 64 of the 128 bit rows in programmable memory array 2. When a logical 1 input signal is placed on input lead 14 of programmable initialize word 12, 16 eight-bit initialize words are provided on data bus 3 by programmable initialize word 12.

Control bus 11 includes 16 control leads 11-1 through 11-16. Decoder 7 places a logical 1 on a selected one of control leads 11-1 through 11-16, which is selected in response to the input signals provided on address input leads $A_0$ through $A_3$. Decoder 7 places a logical 0 on all the remaining deselected leads of data bus 11. Multiplexer 4 selects in response to the signals on control bus 11 one of the sixteen eight-bit binary words carried by data bus 3. Because decoder 7 and multiplexer 4 may select one of 16 eight bit words contained in the 128 bit initialize word, one of 16 possible initialize words may be selected.

Initialize word circuit 12 is implemented by providing a sixty-fifth row of programmable array 2 which is selected by providing a logical 1 signal on lead 14. The sixteen binary words stored in this initialize row are programmed in the same manner as the other rows, thus providing sixteen initialize words. Programmable initialize word 12 is very compact because it is implemented as a sixty-fifth row of programmable memory array 2 rather than a separate circuit such as initialize word register 5 of FIG. 1. In addition, programmable initialize word 12 uses the inherent selection circuitry of programmable array 2 (row selection by providing a logical 1 on one of leads 10-1 through 10-64 or lead 14) thus eliminating the need for circuitry (not shown) in initialize word register 5 (FIG. 1) which deselects the word provided on data bus 19 and selects the internal initialize word, thus eliminating several components.

As previously stated, this embodiment of the invention provides sixteen possible initialize words. Therefore, if a circuit designer requires up to sixteen different binary words to initialize, for example, a central processing unit into different operating modes, such initialize words can be provided in accordance with this invention. The circuit designer may require several initialize words in order to program the central processing unit to respond to various circumstances, such as overheating, power interruption, user initiated reinitialization of the computer system, etc. On the other hand, if a traditional initialize word which is addressed by a single pin and which is entirely independent of the signals received on address bus A is desired, all sixteen programmable initialize words may be programmed to provide the same binary word. When this is done, an initialize input signal on input lead 9 places that binary word in output register 6 regardless of the signals received on input leads $A_0$ through $A_3$. For example, by programming all 16 eight bit words of the initialize words to a logical 0, the eight bit word 00000000 is provided by output register 6 in response to logical 0 on input lead 9 regardless of the signals on address input leads $A_0$ through $A_3$. This output signal is known as a "clear" output signal. For another example, if all 16 eight bit words of the initialize words are programmed to a logical 1, the eight bit word 11111111 is provided by output register 6 in response to a logical 0 on input lead 9 regardless of the signal on address input leads $A_0$ through $A_3$. This output signal is known as a "preset" output signal.

While this specification illustrates specific embodiments of this invention, it is not to be interpreted as limiting the scope of the invention. Other embodiments of this invention will become evident to those of ordinary skill in the art in light of the teachings of this specification For example, the teachings of this invention are equally applicable to other types of memory devices, having configurations other than $64 \times 128$ bits.

We claim:

1. A memory circuit having a plurality of N address input terminals, where N is a positive integer, for receiving address input signals, having M data output terminals, where M is a positive integer, for providing M bit data output words, and having K initialize input terminals, where K is a positive integer, comprising:

means for storing X M-bit data words, where X is a positive integer, wherein said means for storing provides an M-bit data word on said data output terminals in response to said address input signals; and means for providing L initialize data output words where L is an integer greater than one, said means having K initialize input leads each connected to an associated one of said initialize input terminals, wherein said means provides one of said L initialize output words on said data output terminals in response to signals received on said initialize input leads.

2. A memory circuit having a plurality of N address input terminals, where N is a positive integer, for receiving address input signals, having M data output terminals, where M is a positive integer, for providing M bit data output words, and having an initialize input terminal, comprising:

means for storing X M-bit data words, where X is a positive integer, wherein said means for storing provides an M-bit data word on said data output terminals in response to said address input signals; and means for providing L initialize data output words where L is an integer greater than one, said means having an initialize input lead connected to said initialize input terminal, and K address input leads, where K is a positive integer less than or equal to N, connected to selected address input terminals, wherein said means provides one of said L initialize output words on said data output terminals in response to signals received on said initialize input lead and said K initialize input leads.

3. A read only memory circuit (ROM) having a plurality of N address input terminals, where N is a positive integer, for receiving address input signals, having M data output terminals, where M is a positive integer, for providing M bit data output words, and having K initialize input terminals, where K is a positive integer, comprising:

means for nondestructively storing X M-bit data words, where X is a positive integer, wherein said means for storing provides an M-bit data word on said data output terminals in response to said address input signals; and means for providing L initialize data output words, where L is a positive integer greater than one, said means having K initialize input leads each connected to an associated one of said initialize input terminals, wherein said means provides one of said L initialize output words on said data output terminals in response to signals received on said initialize input leads.

4. A memory circuit having a plurality of N address input terminals, where N is a positive integer, for receiving address input signals, having M data output terminals, where M is a positive integer, for providing M bit data output words, and having an initialize input terminal, comprising:

a first decoder having L input leads, where L is a positive integer less than N, connected to selected ones of said address input terminals, and having K output leads, where K is a positive integer;

a programmable logic array having K input leads, each connected to an associated one of said output leads of said first decoder and having I output leads, where I in an integral multiple of M;

a second decoder having H input leads, where H is a positive integer less than N, connected to selected ones of said address input terminals, and having G output leads, where G is a positive integer;

a programmable initialize word circuit having an initialize input lead connected to said initialize input terminal, having I input leads, each input lead connected to an associated one of said output leads of said programmable logic array, and having I output leads, wherein, when an initialize input signal is received on said initialize input lead, said programmable initialize word circuit provides a preprogrammed set of I output signals on said output leads, and wherein, when said initialize input lead does not receive said initialize input signal said programmable initialize word circuit provides the signals received on said input leads on said output leads;

a multiplexer having G address input leads, each connected to an associated one of said output leads of said second decoder, having I input leads, each connected to an associated one of said output leads of said programmable initialize word circuit, and having M output leads, each connected to an associated one of said data output terminals.

* * * * *